United States Patent [19]

Matsumoto et al.

[11] 4,414,196

[45] Nov. 8, 1983

[54] METHOD OF PRODUCING SINGLE CRYSTALLINE, ACICULAR α-FERRIC OXIDE

[75] Inventors: Seiji Matsumoto, Sakai; Tadashi Koga, Osaka; Kiyoshi Fukai, Izumiotsu; Hideji Yamamoto, Asahimachi, all of Japan

[73] Assignee: Sakai Chemical Industry Co., Ltd., Japan

[21] Appl. No.: 322,666

[22] Filed: Nov. 18, 1981

[30] Foreign Application Priority Data

Nov. 27, 1980 [JP] Japan ................. 55-167668

[51] Int. Cl.$^3$ ............................................... C01G 49/06
[52] U.S. Cl. .................................. 423/633; 423/632; 423/634
[58] Field of Search ...................... 423/632, 633, 634

[56] References Cited

U.S. PATENT DOCUMENTS

| 3,252,758 | 5/1966 | Hoch et al. | 423/634 |
| 3,262,755 | 7/1966 | Steinmetz et al. | 423/633 |
| 3,845,198 | 10/1974 | Marcot | 423/634 |
| 4,202,871 | 5/1980 | Matsumoto et al. | 423/632 |

*Primary Examiner*—Jack Cooper
*Attorney, Agent, or Firm*—Wenderoth, Lind & Ponack

[57] ABSTRACT

A method of producing single crystalline, acicular α-ferric oxide particles of narrow particle size distribution is provided. The method comprises heating an aqueous suspension of ferric hydroxide at temperatures of 100°–250° C. at an alkaline pH in the presence both a water soluble organic or inorganic compound capable of forming complexes with iron as a growth regulating agent and α-ferric oxide seed crystals of minor axes not larger than 0.4 microns in average in amounts of 0.1–25 mole % in terms of the Fe content thereof in relation to the ferric hydroxide.

14 Claims, 1 Drawing Figure

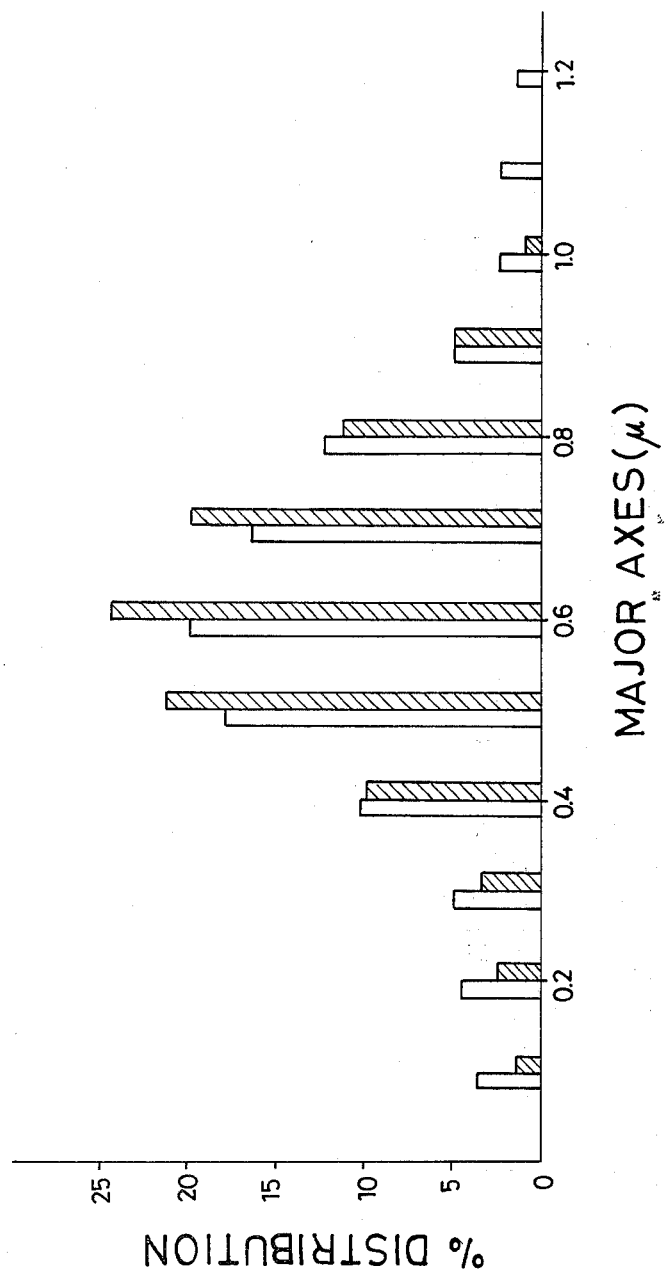

METHOD OF PRODUCING SINGLE CRYSTALLINE, ACICULAR α-FERRIC OXIDE

The present invention relates to a method of producing single crystalline, acicular α-ferric oxide particles particularly useful for the production of magnetic recording materials such as γ-Fe$_2$O$_3$ and magnetite.

Recent developments in magnetic recording media such as audio tapes, video tapes, and other magnetic recording tapes and discs requires improved crystallographic properties of magnetic particles used therein. The magnetic particles heretofore have been produced by calcining acicular goethite or α-FeOOH at a temperature of about 300° C. for dehydration thereof to provide acicular α-Fe$_2$O$_3$, then reducing the α-Fe$_2$O$_3$ at temperatures from about 300° C. to 400° C. in a hydrogen atmosphere to provide magnetic iron oxide or magnetite. When desired, the magnetite is further oxidized to acicular γ-Fe$_2$O$_3$.

However, the dehydration reaction of goethite in the method generates a number of pin holes or voids in the α-Fe$_2$O$_3$ particles produced through which voids the water formed during the reaction evaporates. The voids still remain in magnetite or γ-Fe$_2$O$_3$ produced from the α-Fe$_2$O$_3$, to make the magnetic particles porous, and therefore cause a lowering of the magnetic recording properties of the particles. Furthermore, the goethite tends to change its shape, for example, by fusing together at angles, during the calcination because of its tactoidal structure, and the resulting α-Fe$_2$O$_3$ particles have irregular shapes containing a number of dendrites, protuberances and branches. This makes the required uniform orientation of magnetic particles on the recording media difficult, and causes deterioration of performance of the resulting recording media.

In order to obviate the above difficulties, a method of producing well defined, single crystalline, acicular α-ferric oxide particles has been realized, in which an aqueous suspension of ferric hydroxide is heated at an alkaline pH in the presence of an agent dissolved in the suspension to regulate or control the growth of crystals, and such "growth regulating agents" include organic phosphonic acids and hydroxycarboxylic acids (U.S. Pat. No. 4,202,871 to Matsumoto et al.). The method provides relatively well defined, acicular α-Fe$_2$O$_3$ particles substantially with neither voids nor branches therein. However, the α-Fe$_2$O$_3$ particles thus obtained have been found to have a relatively wide range of particle size distribution. Accordingly, it is still requested to produce acicular α-Fe$_2$O$_3$ particles of smaller particle size distribution, which will further improve magnetic recording performance of magnetic particles derived therefrom.

Therefore, it is an object of the present invention to provide a method of producing single crystalline, acicular α-Fe$_2$O$_3$ particles of a narrower distribution of particle size with neither voids nor branches therein.

According to the invention, there is provided a method of producing single crystalline, acicular α-Fe$_2$O$_3$ particles which comprises: heating an aqueous suspension of amorphous ferric hydroxide at an elevated temperature from 100° C. to 250° C. at an alkaline pH in the presence of an effective amount of a growth regulating agent dissolved in the suspension and α-Fe$_2$O$_3$ seed crystals of minor axes not more than 0.4 microns in average in amounts of 0.1–25 mole % in terms of Fe content in relation to the ferric hydroxide in the suspension, the growth regulating agent being selected from the group consisting of an organic phosphonic acid, a hydroxycarboxylic acid, a polybasic acid, an aminocarboxylic acid, a polyamine, a thioalcohol, an aminosulfonic acid, a polyhydric alcohol, an aromatic sulfonic acid, a β-dicarbonyl compound and a thiocarboxylic acid, for a length of time sufficient to convert the amorphous ferric hydroxide into the acicular ferric oxide.

The starting amorphous ferric hydroxide may be prepared by any known conventional method such as by adding an alkali, e.g., sodium hydroxide, potassium hydroxide or ammonia, to an aqueous solution of water soluble ferric salt, e.g., ferric chloride, ferric sulfate or ferric nitrate, or by oxidizing ferrous hydroxide in water. For example, the ferric hydroxide is prepared by adding an alkali to an aqueous solution of a water soluble ferric salt until the alkalinity of the mixture reaches a pH where almost all the iron content therein precipitates quantitatively as amorphous ferric hydroxide. After filtering off and washing, the precipitates are suspended in water. The thus obtained ferric hydroxide may have therein instead of hydroxyl anion a certain amount of other anions such as chlorine, nitrate or sulfonate originating from the starting ferric salt used depending on the reaction conditions, and such ferric hydroxide may also be used as the starting ferric hydroxide.

The starting suspension contains therein ferric hydroxide in amounts not large enough so that the stirring of the suspension in the presence of growth regulating agent and seed crystals is difficult, and preferably in amounts not more than 1.5 moles/liter, more preferably in amounts of 0.1–1 mole/liter, in terms of the Fe content.

The growth regulating agent herein means an organic or an inorganic compound which is soluble in water, stable under the reaction conditions, namely under heating to at least 100° C. in an alkaline medium, and capable of forming a complex with ferric iron, thereby to regulate or control the direction and speed of growth of α-Fe$_2$O$_3$ crystals produced during the heating of the ferric hydroxide suspension to provide well defined acicular α-Fe$_2$O$_3$ crystals. In a reaction system where the growth regulating agent is absent, the α-Fe$_2$O$_3$ crystals formed have a cubic, platelet or mica-like shape.

An organic growth regulating agent therefore has at least one coordination atom in the molecule such as oxygen, nitrogen and sulfur, and preferably at least one group containing such atoms. Examples of such groups include —OH, —COOH, —O—, =CO, —SO$_3$H, —PO$_3$H$_2$, —NH$_2$, =NOH, ≡N, —SH, —S—, =CS and —OCN. Preferred organic growth regulating agents have two or more coordination groups in the molecule. Preferable organic growth regulating agents include an phosphonic acid and a hydroxycarboxylic acid which are already known as hereinbefore mentioned, and furthermore a polybasic acid, an aminocarboxylic acid, a polyamine, a polyhydric alcohol, a thioalcohol, an aminosulfonic acid, an aromatic sulfonic acid, a thiocarboxylic acid and a β-dicarbonyl compound. The growth regulating agent also includes a salt and an ester of the above compounds so far as they are soluble in water, stable in a heated alkaline media and capable of forming complexes with ferric iron. Inorganic growth regulating agents include phosphates such as sodium phosphate, potassium phosphate and ammonium phosphate.

Various compounds may be used as growth regulating agents in the invention as is described above, however the most preferable are a hydroxycarboxylic acid and an organic phosphonic acid. The hydroxycarboxylic acid includes citric acid, tartaric acid, glycolic acid, malic acid, α-methylmalic acid, α-hydroxyglutaric acid, dihydroxyglutaric acid, propyltatronic acid, agaritic acid, norcaperatic acid, desoxalic acid and salicylic acid. Aliphatic α-hydroxycarboxylic acids are preferred. The hydroxycarboxylic acids may be used in the form of a free acid, a water soluble salt or a water soluble ester.

A first class of preferred organic phosphonic acids is represented by the formula:

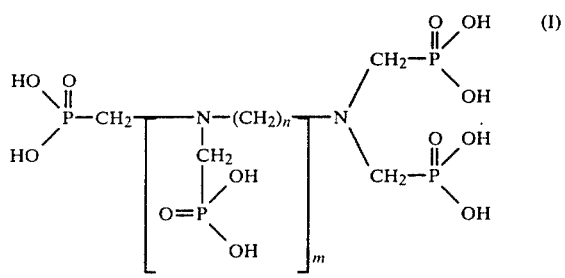

wherein n and m are repeating units and preferably n is 2 to 6, and m is 0 to 5. Specific examples of the class of compounds include aminotri(methylenephosphonic acid), ethylenediaminetetra(methylenephosphonic acid), hexamethylenediaminetetra(methylenephosphonic acid), diethylenetriaminepenta(methylenephosphonic acid), triethylenetetraminehexa(methylenephosphonic acid), tetraethylenepentaminehepta(methylenephosphonic acid), and pentaethylenehexamineocta(methylenephosphonic acid).

A second class of preferable organic phosphonic acids has the following formula:

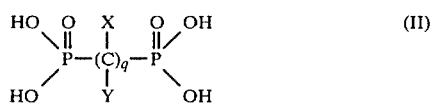

wherein X and Y are hydrogen, hydroxy, amino, or $C_1$-$C_6$ alkyl or aryl, and q is 1 to 6. Specific examples thereof include methylenediphosphonic acid, ethylene-1,1'-diphosphonic acid, ethylene-1,2-diphosphonic acid, propylene-1,1'-diphosphonic acid, propylene-1,3-diphosphonic acid, hexamethylene-1,6-diphosphonic acid, 2,4-dihydroxypentamethylene-2,4-diphosphonic acid, 2,5-dihydroxyhexamethylene-2,5-diphosphonic acid, 2,3-dihydroxybutylene-2,3-diphosphonic acid, 1-hydroxybenzyl-1,1'-diphosphonic acid and 1-aminoethylene-1,1'-diphosphonic acid. Particularly, hydroxyalkylene-1,1'-diphosphonic acids of the formula:

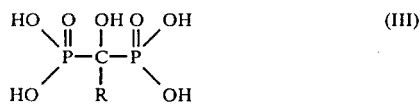

wherein R is hydrogen or $C_1$-$C_5$ alkyl, such as hydroxymethylenediphosphonic acid, 1-hydroxypropylene-1,1'-diphosphonic acid, 1-hydroxybutylene-1,1'-diphosphonic acid and 1-hydroxyhexamethylene-1,1'-diphosphonic acid are preferable. The organic phosphonic acid may be used in the form of a free acid, a water soluble salt or a water soluble ester.

Some examples of other classes of growth regulating agents may be as follows:
polybasic acids: propane-1,2,3-tricarboxylic acid
aminocarboxylic acids: tyrosine
polyamines: tris(2-aminoethyl)amine
polyhydric alcohols: pentaerythritol
aromatic sulfonic acids: sulfophenyliminodiacetic acid
thioalcohols: mercaptoethyliminodiacetic acid
aminosulfonic acids: taurine.

However, it will be apparent that various compounds may be used as an effective growth regulating agent in the invention from the definition of the growth regulating agent.

The amount of growth regulating agent in the suspension is preferably between $1 \times 10^{-5}$ moles and 3 moles, more preferably between $1 \times 10^{-4}$ moles and $1 \times 10^{-1}$ moles per 1 mole of the ferric hydroxide. The use of too small an amount of growth regulating agent will not provide α-$Fe_2O_3$ crystals of well defined acicular configuration while the use of too large an amount of agent will require a much longer reaction time.

According to the invention, the amorphous ferric hydroxide suspension is heated in the presence of α-$Fe_2O_3$ seed crystals as well as the growth regulating agent. The crystal configuration of the seed crystal may vary, for example, acicular, platelet, globular or cubic. However, the minor axis of seed crystal should not be larger than 0.4 microns in average, preferably not larger than 0.2 microns in average. The minor axis herein means the shortest axis or diameter of crystal when the crystal is acicular, platelet or globular, and the shortest edge when the crystal is cubic.

When α-$Fe_2O_3$ crystals of minor axes larger than 0.4 microns in average are used as seeds, the resulting acicular α-$Fe_2O_3$ crystals have small "acicularity" which is herein defined as the ratio of major axes to minor axes of the crystals in average, but also large particle size. As results, the α-$Fe_2O_3$ particles will fail to provide magnetic particles of high performance. The lower limit of average length of minor axes of seed crystals may be about 100 Å, although not critical. α-$Fe_2O_3$ particles on the market produced by conventional methods i.e. of average length of minor axes between 0.4 microns and 100 Å, may be used as seed crystals in the invention.

The seed crystals should be present in the ferric hydroxide suspension in amounts of 0.1–25 mole %, preferably 0.5–15 mole % in terms of Fe content in relation to the ferric hydroxide in the suspension. When the seeds are present in amounts smaller than 0.1 mole % in terms of Fe content in relation to the ferric hydroxide, the resulting α-$Fe_2O_3$ will be so large in particle size whereas if the seeds are present in amounts of more than 25 mole %, the resulting α-$Fe_2O_3$ particles will be so small in acicularity and/or in particle size, that the particles are not suitable for the production of high performance magnetic particles.

It is sufficient that the growth regulating agent and the seeds be present in the ferric hydroxide suspension when the suspension is heated. That is, any method may be employed to prepare the starting suspension of ferric hydroxide containing the agent and seeds therein. Therefore, for example, the agent and/or seeds may be added to an aqueous solution of water soluble ferric salt, and then an alkali is added to the mixture to precipitate the ferric hydroxide. In this case, the growth regulating agent may be incorporated into the ferric hydroxide precipitates, and further addition of agent to the resultant ferric hydroxide suspension may be omitted. However, it is preferred that a ferric hydroxide suspension is first prepared, and then the agent and seeds are added to the suspension.

The aqueous suspension of ferric hydroxide having the agent and seeds is then subjected to a heat treatment at an elevated temperature at an alkaline pH with stirring for a period of time sufficient to convert the amorphous ferric hydroxide into the desired acicular $\alpha$-$Fe_2O_3$ particles. The pH of the suspension is adjusted at larger than 7, preferably 8–12.5 by the addition thereto of an alkali, e.g., sodium hydroxide, potassium hydroxide or ammonia. The alkali may be added to the suspension before or after the addition of the agent and seed crystals to the suspension.

The reaction temperature is not lower than 100° C. When the reaction is carried out at temperatures below 100° C., the obtained $\alpha$-$Fe_2O_3$ particles have branching structures, e.g., crosswise or T-shape, and include geothite particles. That is, the obtained $\alpha$-$Fe_2O_3$ particles are of crystallographic configuration less defined and less acicular. The upper limit of reaction temperature depends on decomposition points of growth regulating agent used, and usually the reaction temperature is between 100° C. and 250° C., preferably between 130° C. and 200° C. The reaction time varies depending upon the other reaction conditions, and usually between several tens of minutes and several hours. The reaction is usually carried out in a closed vessel such an autoclave with stirring. There is no particular need to carry out the reaction under an increased pressure. The reaction mixture is filtered, and the product is washed with water and dried.

The $\alpha$-$Fe_2O_3$ particles thus obtained according to the invention have substantially neither voids nor branches therein, and hence are of high density, but also have narrow distribution of particle size.

The accompanying drawing illustrates an example of the particles size distribution of $\alpha$-$Fe_2O_3$ particles produced by the method of the invention shown by shaded blocks, and the particle size distribution of $\alpha$-$Fe_2O_3$ particles produced in the absence of $\alpha$-$Fe_2O_3$ seed crystals.

Therefore, the magnetic particles prepared from the $\alpha$-$Fe_2O_3$ particles have improved magnetic recording performance. The acicular $\alpha$-$Fe_2O_3$ particles may be converted to magnetic particles by a method well known in the art. For instance, acicular $\alpha$-$Fe_2O_3$ particles are reduced by heating thereof at temperatures of 300°–500° C. in a hydrogen atmosphere to magnetite which well retains the acicular configuration of the starting $\alpha$-$Fe_2O_3$ particles, and then the magnetite is oxidized at temperatures of 200°–300° C. to provide $\gamma$-$Fe_2O_3$ particles which also well retain the acicular configuration of the starting $\alpha$-$Fe_2O_3$. The resulting magnetite or $\gamma$-$Fe_2O_3$ particles also have substantially neither voids nor branches therein, and hence are of high density, and in addition thereto narrow particle size distribution, and therefore the magnetic particles have high dispersability in vehicle of magnetic paint and uniform orientation on recording media.

When desired, the magnetic particles obtained may be further oxidized at 250°–300° C. to convert the magnetite contained therein into $\gamma$-$Fe_2O_3$ particles of higher performance.

The invention will be more readily understood with reference to the following examples; however, these examples are intended to illustrate the invention and are not to be construed as limiting the scope of the invention.

EXAMPLE 1

To 3 liters of an aqueous solution of ferric sulfate (Fe content, 17.0 g/liter) was bubbled ammonia gas with stirring until the pH of the solution became 7.5.

The resulting red-brown, amorphous precipitates were filtered off and washed with about 2 liters of hot water. The precipitates were suspended in water to prepare 1 liter of ferric hydroxide suspension.

To the suspension were added 1.1 g of acicular $\alpha$-$Fe_2O_3$ seed crystals (Fe content, 1.5 mole % in relation to ferric hydroxide) 200 Å in average minor axes as a slurry dispersed in water and 3.35 g of ethylenediaminetetra(methylenephosphonic acid), and then a 5% aqueous solution of sodium hydroxide to adjust the suspension at a pH of 11.0. The suspension was then heated in a closed vessel at a temperature of 180° C. for 30 minutes with stirring.

The resultant red-orange precipitates were filtered off, washed with water and air-dried to provide 72 g of the desired acicular particles. The particles were identified as $\alpha$-$Fe_2O_3$ by X-ray diffraction crystallography. By the electron microscopic observation on 200 crystals of $\alpha$-$Fe_2O_3$ thus obtained, they were found to be acicular crystals 0.1 microns in average minor axis and 0.6 microns in average major axis. The particle size distribution thereof in terms of major axis length is shown in the accompanying drawing as shaded blocks.

The $\alpha$-$Fe_2O_3$ particles were reduced by heating thereof in a rotary electric furnace in a hydrogen atmosphere at 400° C. for 2 hours, and then oxidized with air at a temperature of 200° C. for 1 hour. No formation of voids, branches or aggregates occurred during the foregoing treatment. The resulting $\gamma$-$Fe_2O_3$ particles were found to retain substantially the same acicular configuration as that of the starting $\alpha$-$Fe_2O_3$ particles.

100 Parts by weight of the above $\gamma$-$Fe_2O_3$ particles were added to and mixed with a vehicle composed of 5 parts by weight of nitrocellulose, 2.5 parts by weight of vinyl chloride-vinyl acetate copolymer, 17.5 parts by weight of urethane resin and 253 parts by weight of organic solvent containing therein an effective amount of dispersing agent, to prepare a magnetic paint. The paint was then applied on a polyethylene terephthalate tape to form a magnetic layer about 10 microns thick and dried to provide a magnetic recording tape. The magnetic recording properties of the tape are shown in Table 1.

TABLE 1

| | Magnetic tape with $\gamma$-$Fe_2O_3$ of EXAMPLE 1 | Magnetic tape with $\gamma$-$Fe_2O_3$ of REFERENCE EXAMPLE 1 |
|---|---|---|
| Coercive force | 410 Oe | 402 Oe |
| Saturation magnetization | 1750 Gauss | 1750 Gauss |
| Residual magnetization | 1560 Gauss | 1520 Gauss |
| Squareness ratio | 0.89 | 0.87 |
| Switching field distribution | 106 Oe | 129 Oe |
| Normalized switching field distribution | 0.26 | 0.32 |

REFERENCE EXAMPLE 1

$\alpha$-$Fe_2O_3$ particles were prepared in the same manner as in Example 1 except the absence of $\alpha$-$Fe_2O_3$ seed crystals. By the electron microscopic observation on 200 crystals, they were found to be 0.6 microns in average major axis and 0.1 micron in average minor axis, however, they had a wider distribution of particle size in terms of major axes of crystals, as is also shown in the accompanying drawing.

The α-Fe$_2$O$_3$ particles were converted into γ-Fe$_2$O$_3$ particles, which were then applied on a polyethylene terephthalate tape to prepare a magnetic recording tape in the same manner as in Example 1. The magnetic recording properties of the tape are shown in Table 1.

EXAMPLES 2–21

Acicular α-Fe$_2$O$_3$ particles were prepared in the same manner as in Example 1, and the sizes thereof are shown in Table 2 together with starting ferric salts and alkalis, α-Fe$_2$O$_3$ seed crystals and growth regulating agents used, and the reaction conditions.

TABLE 2

| | Preparation of Fe(OH)$_2$ | | Preparation of α-Fe$_2$O$_3$ Particles | | | | | | | Size of Acicular[2] |
|---|---|---|---|---|---|---|---|---|---|---|
| | | | α-Fe$_2$O$_3$ Seed Crystals | | Growth Regulating Agents | | Reaction Conditions | | | |
| EXAMPLES | Ferric Salts (Fe, g) | Alkalis | Shape and Size (microns when not specified) | Amounts Used (mole %)[1] | | Amounts Used (g) | pH | Time (hr) | Temp. (°C.) | α-Fe$_2$O$_3$ Obtained |
| 2 | FeCl$_3$ (50.1) | NaOH | Hexagonal plate 700 Å dia. 200 Å thick | 10 | Aminotri(methylene phosphonic acid) | 1.6 | 11.2 | 1 | 150 | 0.7 × 0.1 |
| 3 | FeSO$_4$[3] (26.0) | NaOH | Acicular[2] 0.2 × 0.05 | 5 | Diethylenetriamine-hepta(methylene phosphonic acid) | 2.0 | 11.7 | 0.5 | 190 | 0.5 × 0.08 |
| 4 | Fe(NO$_3$)$_3$ (55.5) | NaOH | Acicular 0.2 × 0.05 | 5 | 1-Hydroxyethylene-1,1'-diphosphonic acid | 1.0 | 12.0 | 0.5 | 170 | 0.7 × 0.07 |
| 5 | FeCl$_3$ (45.6) | NH$_3$ | Acicular 0.2 × 0.05 | 0.5 | 1-Hydroxypropyl-1,1'-diphosphonic acid | 1.5 | 10.8 | 1 | 170 | 1.2 × 0.1 |
| 6 | Fe$_2$(SO$_4$)$_3$ (42.4) | NaOH | Acicular 0.2 × 0.05 | 25 | Aminotri(methylene phosphonic acid) and 1-Hydroxyethylene-1,1'-diphosphonic acid | 0.96 0.32 | 10.8 | 0.5 | 200 | 0.3 × 0.06 |
| 7 | FeCl$_3$ (30.4) | NaOH | Cubic 400 Å | 5 | Mixture of Diethylene-triaminepenta(methylenephosphonic acid, Triethy-lenetetraminehexa(methy-lenephosphonic acid) and Tetraethylenepentamine-hepta(methylenephosphonic acid) | 3.0 | 11.0 | 1 | 180 | 0.8 × 0.1 |
| 8 | FeCl$_3$ (20.1) | NH$_3$ | Acicular 0.4 × 0.2 | 20 | Sodium citrate 116 ml of 0.1 M solution | | 11.9 | 3 | 130 | 0.8 × 0.2 |
| 9 | FeCl$_3$ (22.8) | NaOH | Cubic 200 Å | 3 | dl-Monomethyl tartarate | 3.3 | 9.3 | 2 | 150 | 0.6 × 0.1 |
| 10 | Fe$_2$(SO$_4$)$_3$ (25.0) | NaOH | Cubic 200 Å | 3 | Agaritic acid | 5.3 | 11.8 | 0.5 | 170 | 0.5 × 0.1 |
| 11 | FeCl$_3$ (34.2) | NaOH | Cubic 200 Å | 3 | dl-Malic acid | 1.2 | 10.4 | 2 | 120 | 0.8 × 0.1 |
| 12 | Fe(NO$_3$)$_3$ (25.0) | NaOH | Cubic 200 Å | 3 | dl-Tartaric acid 2H$_2$O | 0.2 | 11.3 | 1 | 180 | 0.6 × 0.06 |
| 13 | Fe$_2$(SO$_4$)$_3$ (18.0) | NaOH | Cubic 200 Å | 3 | Sodium citrate 2H$_2$O Desoxalic acid | 0.8 3.3 | 10.2 | 2 | 150 | 0.8 × 0.1 |
| 14 | Fe(NO$_3$)$_3$ (40.0) | NaOH | Acicular 0.3 × 0.05 | 4 | 1-Aminoethylene-1,1'-diphosphonic acid | 0.7 | 9.8 | 0.5 | 220 | 0.7 × 0.08 |
| 15 | FeCl$_3$ (34.0) | NaOH | Acicular 0.3 × 0.05 | 4 | Taurine | 2.1 | 11.0 | 2 | 140 | 0.7 × 0.1 |
| 16 | Fe$_2$(SO$_4$)$_3$ (55.5) | NaOH | Acicular 0.3 × 0.05 | 10 | Mercaptoethylimino-diacetic acid | 6.1 | 11.5 | 1 | 150 | 0.5 × 0.1 |
| 17 | FeCl$_3$ (34.0) | NaOH | Acicular 0.3 × 0.05 | 15 | Tyrosine | 3.5 | 12.0 | 0.5 | 180 | 0.5 × 0.1 |
| 18 | FeCl$_3$ (34.0) | NaOH | Acicular 0.3 × 0.05 | 10 | Propane-1,2,3-tri-carboxylic acid | 4.2 | 11.5 | 1 | 170 | 0.5 × 0.08 |
| 19 | Fe(NO$_3$)$_3$ (40.0) | NaOH | Acicular 0.3 × 0.05 | 10 | Tris(2-aminoethyl)-amine | 2.7 | 11.0 | 1 | 170 | 0.6 × 0.1 |
| 20 | FeCl$_3$ (34.0) | NaOH | Acicular 0.3 × 0.05 | 5 | Pentaerythritol | 3.8 | 10.5 | 4 | 120 | 0.7 × 0.1 |
| 21 | FeCl$_3$ (34.0) | NaOH | Acicular 0.3 × 0.05 | 10 | Sulfophenylimino-diacetic acid | 5.4 | 11.0 | 2 | 150 | 0.5 × 0.1 |

[1] Mole % in relation to the ferric hydroxide in the suspension.
[2] Major axis length (microns) × minor axis length (microns)
[3] Ferrous sulfate was oxidized with H$_2$O$_2$ at a pH of 0.9 and an alkali was added to an aqueous solution of the ferric salt.

What is claimed is:

1. A method of producing single crystalline, acicular α-ferric oxide of narrow particle size distribution which comprises: heating an aqueous suspension of amorphous ferric hydroxide at an elevated temperature from 100° C. to 250° C. at an alkaline pH in the presence of an effective amount of at least one growth regulating agent dissolved in the suspension and α-ferric oxide seed crystals of minor axes not more than 0.4 microns in average in amounts of 0.1–25 mole % in terms of Fe content in relation to the ferric hydroxide in the suspension, the growth regulating agent being selected from the group consising of an organic phosphonic acid, a hydroxycarboxylic acid, a polybasic acid, an aminocarboxylic acid, an aminosulfonic acid, an aromatic sulfonic acid, a thiocarboxylic acid, a water soluble salt of any one of the acids, a water soluble ester of any one of the acids, a polyamine, a thioalcohol, a polyhydric alcohol and a β-dicarbonyl compound, for a length of time sufficient to convert the amorphous ferric hydroxide into the acicular α-ferric oxide.

2. The method as claimed in claim 1 wherein the organic phosphonic acid has the formula:

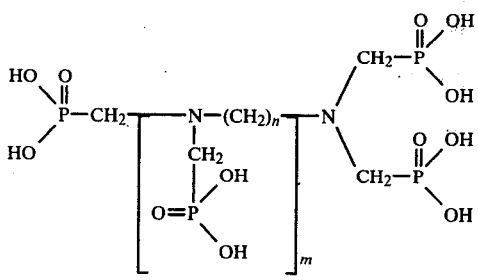

wherein n is an integer of 2–6, and m is an integer of 0–5.

3. The method as claimed in claim 1 wherein the organic phosphonic acid has the formula:

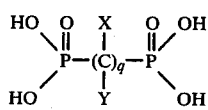

wherein X and Y are hydrogen, hydroxy, amino or $C_1$–$C_6$ alkyl or aryl, and q is an integer of 1–6.

4. The method as claimed in claim 1 wherein the organic phosphonic acid has the formula:

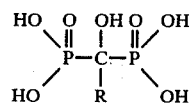

wherein R is hydrogen or $C_1$–$C_5$ alkyl.

5. The method as claimed in claim 1 wherein the hydroxycarboxylic acid is an aliphatic α-hydroxycarboxylic acid selected from the group consisting of citric acid, tartaric acid, glycolic acid, malic acid, dihydroxyglutaric acid, propyltartronic acid, agaritic acid, norcaperatic acid and desoxalic acid.

6. The method as claimed in claim 1 wherein the polybasic acid is propane-1,2,3-tricarboxylic acid.

7. The method as claimed in claim 1 wherein the aminocarboxylic acid is tyrosine.

8. The method as claimed in claim 1 wherein the polyamine is tris(2-aminoethyl)amine.

9. The method as claimed in claim 1 wherein the polyhydric alcohol is pentaerythritol.

10. The method as claimed in claim 1 wherein the aromatic sulfonic acid is sulfophenyliminodiacetic acid.

11. The method as claimed in claim 1 wherein the thioalcohol is mercaptoethyliminodiacetic acid.

12. The method as claimed in claim 1 wherein the aminosulfonic acid is taurine.

13. The method as claimed in claim 1 wherein the pH ranges from 8.0 to 12.5.

14. The method as claimed in claim 1 wherein the growth regulating agent is present in the suspension at a concentration of $1 \times 10^{-5}$ to 3 moles per mole of the ferric hydroxide in the suspension.

* * * * *